(12) United States Patent  
Goodelle et al.

(10) Patent No.: US 7,763,488 B2
(45) Date of Patent: Jul. 27, 2010

(54) METHOD OF FABRICATING MEMS DEVICE

(75) Inventors: Jason P. Goodelle, McKees Rocks, PA (US); Kaigham J. Gabriel, Pittsburgh, PA (US)

(73) Assignee: Akustica, Inc., Pittsburgh, PA (US)

( * ) Notice: Subject to any disclaimer, the term of this patent is extended or adjusted under 35 U.S.C. 154(b) by 524 days.

(21) Appl. No.: 11/446,398

(22) Filed: Jun. 5, 2006

(65) Prior Publication Data

US 2007/0278601 A1 Dec. 6, 2007

(51) Int. Cl.
*H01L 21/00* (2006.01)
(52) U.S. Cl. .................. 438/51; 257/704; 257/E21.499
(58) Field of Classification Search ................. 438/51; 257/704, E21.499
See application file for complete search history.

(56) References Cited

U.S. PATENT DOCUMENTS

| 4,545,926 | A | 10/1985 | Fouts, Jr. et al. | 252/511 |
| 4,882,212 | A | 11/1989 | SinghDeo et al. | 428/76 |
| 5,736,783 | A | 4/1998 | Wein et al. | 257/691 |
| 5,827,999 | A | 10/1998 | McMillan et al. | 174/52.4 |
| 5,885,911 | A | 3/1999 | Ashcraft et al. | 442/117 |
| 6,243,474 | B1 | 6/2001 | Tai et al. | 381/174 |
| 6,320,257 | B1 | 11/2001 | Jayaraj et al. | 257/723 |
| 6,557,978 | B2 | 5/2003 | Silverbrook | 347/54 |
| 6,664,713 | B2 | 12/2003 | Boesen | 310/328 |
| 6,849,800 | B2 | 2/2005 | Mazurkiewicz | 174/35 MS |
| 6,943,419 | B2 * | 9/2005 | Wong et al. | 257/416 |
| 7,436,054 | B2 * | 10/2008 | Zhe | 257/686 |
| 2002/0088537 | A1 * | 7/2002 | Silverbrook | 156/247 |
| 2002/0102004 | A1 * | 8/2002 | Minervini | 381/175 |
| 2003/0189242 | A1 * | 10/2003 | Ma et al. | 257/678 |
| 2004/0166662 | A1 * | 8/2004 | Lei | 438/614 |
| 2005/0018864 | A1 | 1/2005 | Minervini | 381/175 |
| 2005/0189622 | A1 * | 9/2005 | Humpston et al. | 257/659 |
| 2006/0131731 | A1 * | 6/2006 | Sato | 257/704 |

* cited by examiner

*Primary Examiner*—Steven J Fulk
(74) *Attorney, Agent, or Firm*—Kenyon & Kenyon LLP

(57) ABSTRACT

A MEMS device includes a chip carrier having an acoustic port extending from a first surface to a second surface of the chip carrier, a MEMS die disposed on the chip carrier to cover the acoustic port at the first surface of the chip carrier, and an enclosure bonded to the chip carrier and encapsulating the MEMS die.

31 Claims, 5 Drawing Sheets

METHOD OF FABRICATING MEMS DEVICE

BACKGROUND OF THE INVENTION

1. Field of the Invention

The present invention relates to a micro-electro-mechanical system (MEMS) device and a method of fabricating the same.

2. Discussion of the Related Art

In general, micro-electro-mechanical system (MEMS) devices are the integration of mechanical elements, such as sensors, actuators, and electronics, on a common silicon substrate using integrated circuit (IC) processes. For example, micromechanical components are fabricated using processes that selectively etch away parts of the silicon wafer or add new structural layers to form the mechanical and/or electromechanical devices.

The fabrication of MEMS devices allows for on-chip devices that include both microsensors and microactuators, as well as control systems to operate the microactuators and receive information from the microsensors. However, MEMS devices require encapsulation to prevent external interference with the functions of the microsensors and microactuators. Currently, present fabrication processing is inefficient and costly due to the combination of individual steps required to fabricate a single MEMS device.

SUMMARY OF THE INVENTION

Accordingly, the present invention is directed to a MEMS device and a method of fabricating a MEMS device that substantially obviates one or more of the problems due to limitations and disadvantages of the related art.

An object of the present invention is to provide a MEMS device that may be efficiently fabricated using individual MEMS device components.

Another object of the present invention is to provide a method of fabricating a MEMS device using individual MEMS device components.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a MEMS device includes a chip carrier having an acoustic port extending from a first surface to a second surface of the chip carrier, a MEMS die disposed on the chip carrier to cover the acoustic port at the first surface of the chip carrier, and an enclosure bonded to the chip carrier and encapsulating the MEMS die.

In another aspect, a method of fabricating a MEMS device includes providing an enclosure carrier die having a plurality of individual enclosures in a matrix configuration, providing a chip carrier die having a plurality of individual chip carriers in the matrix configuration, each of the individual chip carriers include an acoustic port formed completely through a thickness of the individual chip carriers, mounting a plurality of MEMS devices onto the plurality of individual chip carriers, bonding the enclosure carrier die onto the chip carrier die to encapsulating each of the mounted MEMS devices with one of the plurality of individual enclosures, and separating the bonded enclosure carrier die and chip carrier die to produce a plurality of individual MEMS devices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
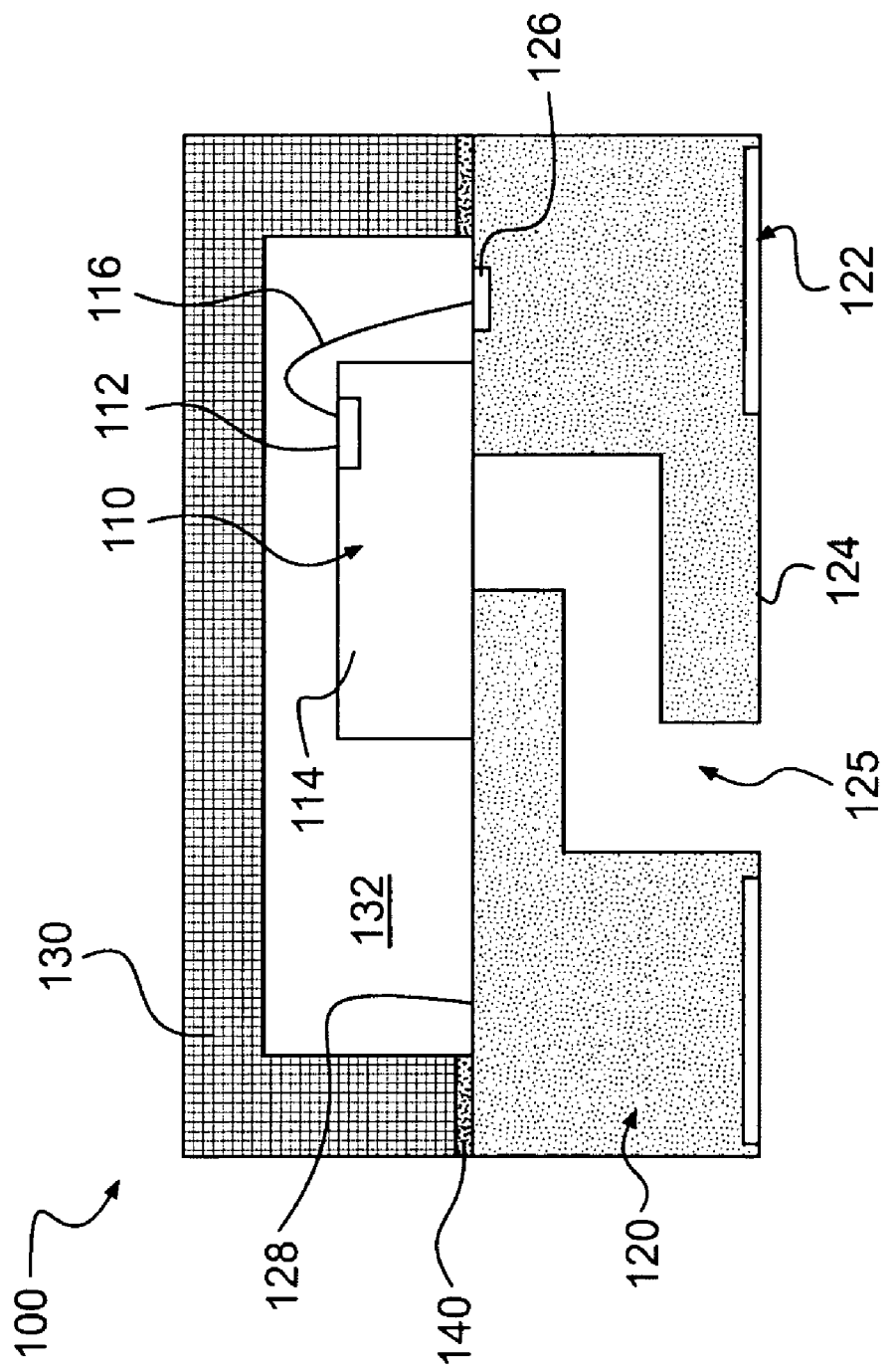
FIG. 1 is a schematic side view of an exemplary MEMS device according to the present invention.

FIG. 1 is a schematic side view of an exemplary MEMS device according to the present invention. In FIG. 1, a MEMS device 100 may include a MEMS die 110 mounted onto a chip carrier 120 that is encapsulated by an enclosure 130. The enclosure 130 may be formed as a molded single piece enclosure that is isotropically electrically conductive. Accordingly, the enclosure 130 may be bonded to the chip carrier 120 using an adhesive bond 140 along a periphery of the chip carrier 120 to seal an interior region 132 of the enclosure 130 from an exterior of the MEMS device 100. The adhesive bond 140 may include an electrically conductive material, such as a paste, supporting film, or tape, in order to provide for an electrical interconnection between the electrically conductive enclosure 130 and the chip carrier 120.

In FIG. 1, the interior region 132 of the enclosure 130 may include an inert atmosphere, or may have a pressure lower or greater than the exterior of the MEMS device 100. In addition, the enclosure 130 may include electrically conductive materials in order to prevent transmission of any electromagnetic radiation from the MEMS die 110, or to prevent any electromagnetic radiation from interfering with the MEMS die 110. For example, the enclosure 130 may be molded using a thermoplastic or thermosetting polymer material, such as epoxy molding compound, liquid crystal polymer, or polyetheretherketone (PEEK), and an electrically conductive material, such as metal particles or carbon fibers or fillers. Specifically, the conductive thermoplastic or conductive thermosetting polymer material may have a sufficient heat deflection temperature in order to survive subsequent conventional lead-free surface mount processes. However, lower heat deflection temperature materials can be used in compliance with non lead-free surface mount processes.

In FIG. 1, the chip carrier 120 may include a plurality of conductive surfaces to facilitate surface mounting of the MEMS device 100 onto a substrate. For example, the chip carrier 120 may include a plurality of land grid array (LGA) pads 122 disposed along a first surface 124 of the chip carrier 120. In addition, the chip carrier 120 may include a plurality of carrier pads 126 disposed along a second surface 128 of the chip carrier 120. Accordingly, the die pads 126 may be electrically connected to the LGA pads 122 using a plurality of alternating conductive and insulating layers (not shown) within the chip carrier 120. Although not shown, additional carrier pads may be provided along other surfaces of the chip carrier 120 to provide additional conductive pathways to the exterior of the MEMS device 100.

The MEMS die 110 may include a plurality of conductive pads 112 disposed along a first surface 114 of the MEMS die 110. Accordingly, the MEMS die 110 may be electrically connected to the chip carrier 120 via the conductive pads 112 of the MEMS die 110 and the die pads 126 of the chip carrier 120 via conductive wires 116. Although not specifically shown, the MEMS die 110 may also include additional die pad disposed on other surfaces of the MEMS die 110 to provide additional conductive pathways to the chip carrier 120, to other MEMS dies 110, or to other MEMS devices 100.

Alternatively, the MEMS die 110 may be formed having a flip-chip design such that the use of the conductive wires 116 would be unnecessary. Accordingly, the conductive pads 112 of the MEMS die 110 may be formed of solder bumps or balls that would face the second surface 128 of the chip carrier 120. However, using the flip-chip design would require that the second surface 128 of the chip carrier 120 to be flush with the corresponding surface of the MEMS die 110 in order to form a tight seal of the MEMS die 110 and the chip carrier 120.

As shown in FIG. 1, the chip carrier 104 may include an acoustic port 125 that extends from the first surface 124 to the second surface 128 of the chip carrier 120. Although the acoustic port 125 is shown to include a square-shaped pathway, other geometries may be used. For example, the acoustic port 125 may be formed having circular and/or elliptical geometries. Moreover, the acoustic port 125 may have conventional geometries known in the acoustic arts. The acoustic port 125 may serve to prevent debris from being transmitted onto the MEMS die 110.

As shown in FIG. 1, the acoustic port 125 has a first opening corresponding to the MEMS die 110 and a second opening corresponding to the first surface 124 of the chip carrier 120. Accordingly, the first and second openings are offset from one another. However, although not specifically shown, the path of the acoustic port 125 may be varied according to the desired acoustic response by the MEMS die 110. Moreover, a plurality of acoustic ports 125 may be provided in the chip carrier 120 for purposes of design and desired response by the MEMS die 100.

The MEMS die 110 may be positioned on the second surface 128 of the chip carrier 120 to be in communication with the acoustic port 125. Accordingly, changes of air pressure at the exterior of the MEMS device 100 may be transmitted to the MEMS die 110 via the acoustic port 125. For example, if the MEMS device was a sensor, such as a microphone, then the MEMS die 110 could sense and measure the change of air pressure at the exterior of the MEMS device 100 via the acoustic port 125. In addition, if the MEMS device was an actuator, such as a speaker, then the MEMS die 110 could produce a change of air pressure to the exterior of the MEMS device 100 via the acoustic port 125. Furthermore, the MEMS die 110 could include a motion or force measuring device, such as an accelerometer, or could include a motion or force measuring device in addition to any of the above-detailed devices on the MEMS die 110.

Figure 2A:
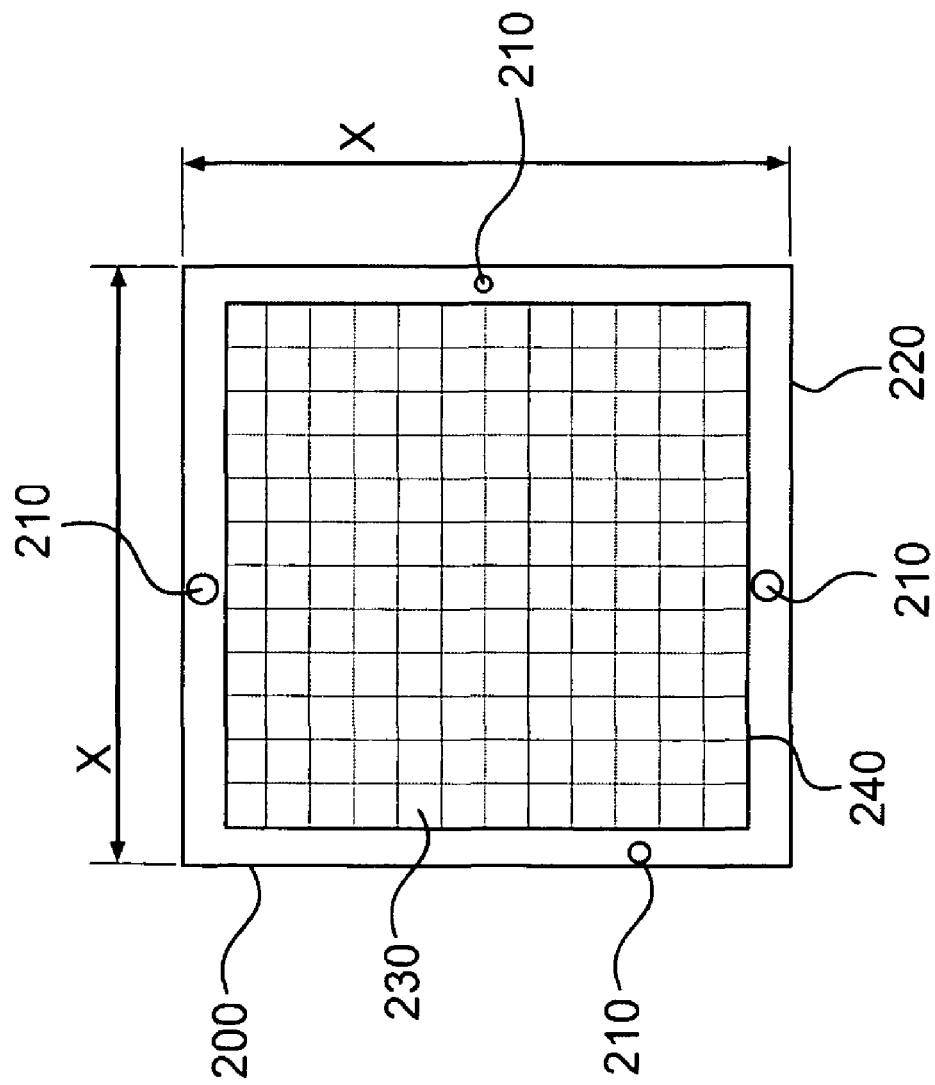
FIG. 2A is a schematic top view of an exemplary enclosure carrier die according to the present invention.

FIG. 2A is a schematic top view of an exemplary enclosure carrier die according to the present invention. In FIG. 2A, an array of the enclosures 130 (in FIG. 1) may be formed of an enclosure carrier die 200. For example, the enclosure carrier die 200 may be formed using the exemplary molding process detailed above in order to produce a plurality of the enclosures 230 formed on a matrix array configuration. In addition, the enclosure carrier die 200 may include alignment marks (or holes) 210 formed along an outer carrier frame 220. Accordingly, the alignment marks (or holes) 210 may be used during subsequent fabrication of the MEMS device 100 (in FIG. 1).

The enclosure carrier die 200 may be formed have either a square or rectangular geometry, or may be formed having a circular geometry with a matrix array of the enclosures 130 (in FIG. 1). For example, a square geometry of the enclosure carrier die 200 may have sides X of about 60 mm, and a thickness of about 1 mm. Of course, the dimensions of the enclosure carrier die 200 may vary depending upon the actual size of the MEMS device 100 (in FIG. 1), and the size of the MEMS die 110. However, as shown in FIG. 1, the dimensions of the enclosure 130 should be commensurate with the dimensions of the chip carrier 120 to ensure the complete sealing of the enclosure 130 with the chip carrier 120.

In FIG. 2A, each of the individual enclosures 230 of the enclosure carrier die 200 will subsequently be singulated using either a saw blade or laser after further fabrication processing. Accordingly, each of the enclosures 230 of the enclosure carrier die 200 are spaced apart from each other by a spacing 240 approximately equal to a kerf of the saw blade or a width of the laser beam used to singulate the individual enclosures 230. In addition, outermost ones of the enclosures 230 adjacent to the outer carrier frame 220 are spaced apart from the outer carrier frame 220 by the spacing 240.

Figure 2B:
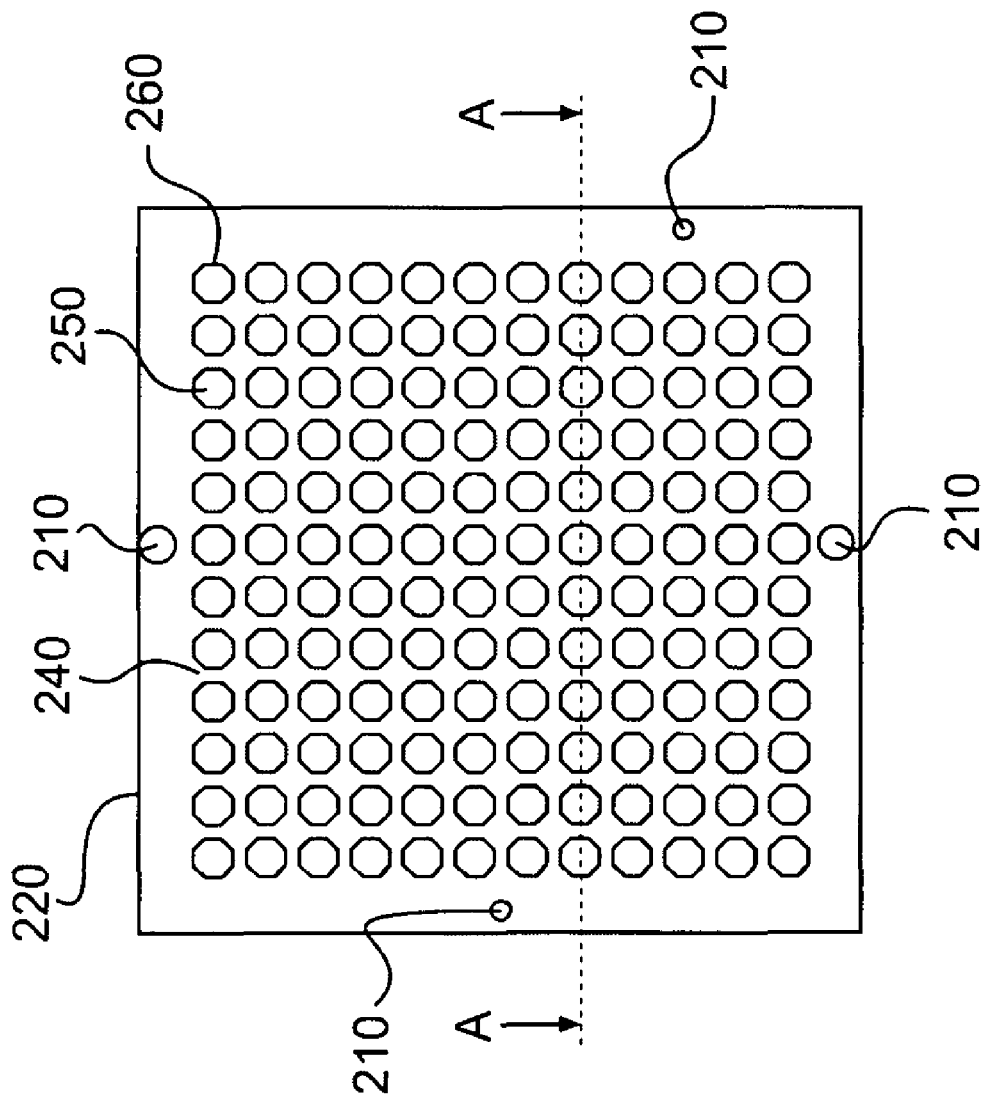
FIG. 2B is a schematic bottom view of the exemplary enclosure carrier die of FIG. 2A according to the present invention.
Figure 2C:
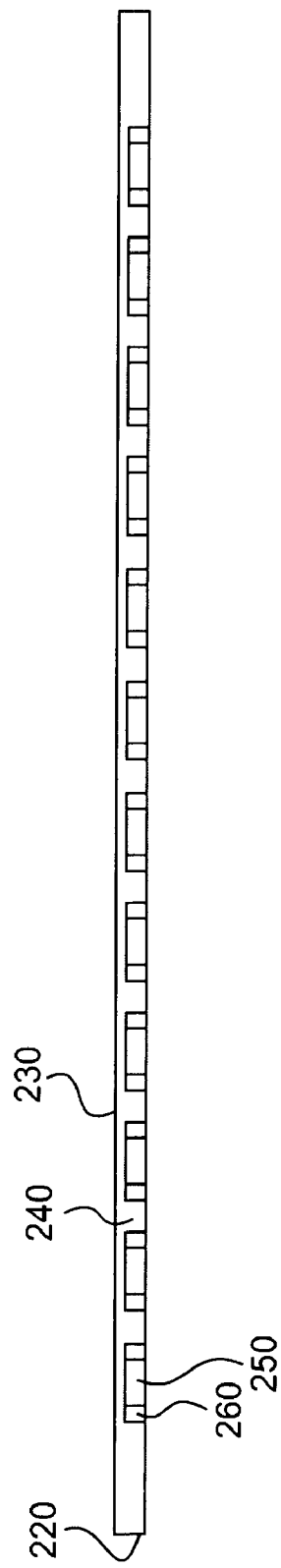
FIG. 2C is a cross sectional view of the exemplary carrier die along A-A of FIG. 2B according to the present invention.

FIG. 2B is a schematic bottom view of the exemplary enclosure carrier die of FIG. 2A according to the present invention. In FIG. 2B, each of the enclosures 230 of the enclosure carrier die 200 include a cavity portion 250 surrounded by sidewalls 260. Accordingly, as shown in FIG. 2C, distances between each of the enclosures include twice the thickness of the sidewalls 260 and the spacing 240.

Figure 3:
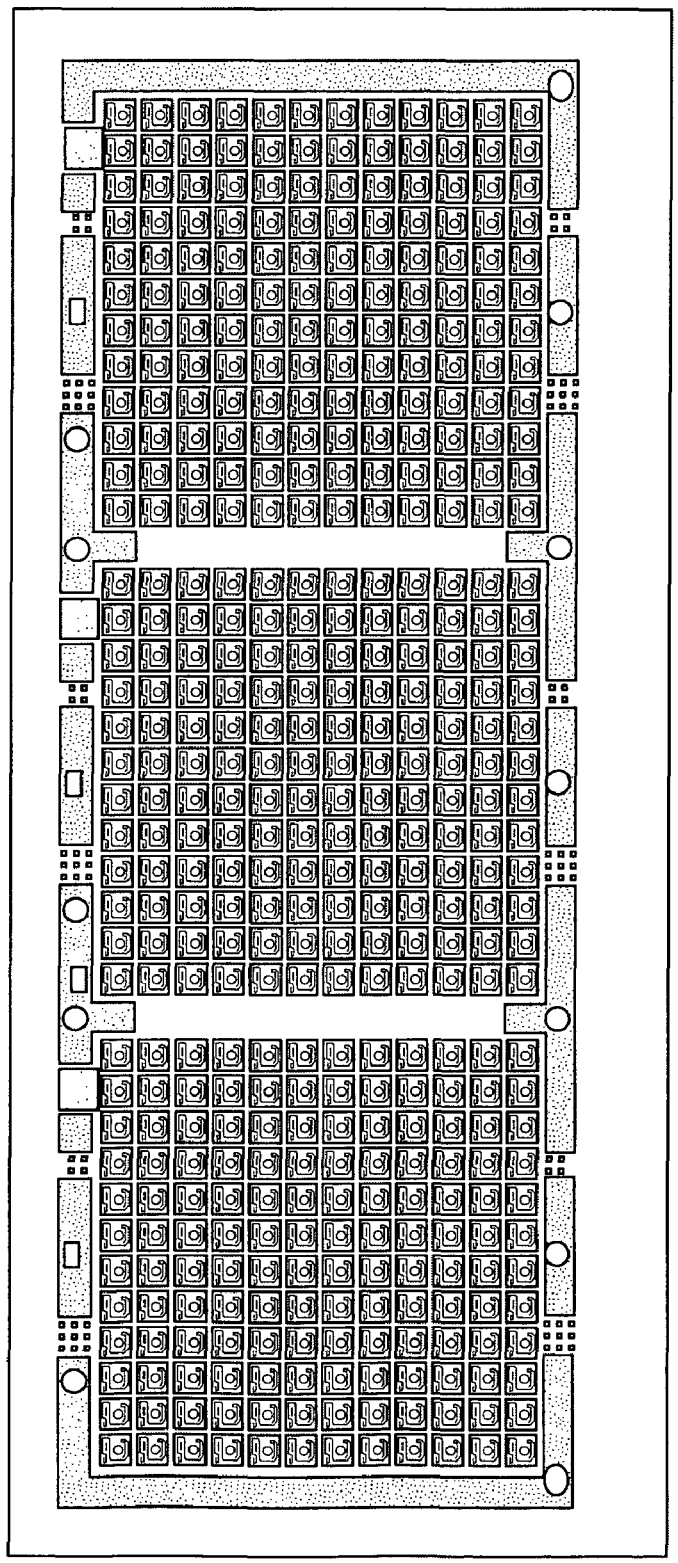
FIG. 3 is a schematic plan view of an exemplary chip carrier die according to the present invention.

FIG. 3 is a schematic plan view of an exemplary chip carrier array according to the present invention. In FIG. 3, a chip carrier array 300 may include a plurality of chip carrier dies 310, wherein each of the chip carrier dies 310 may have a matrix configuration of chip carriers 320 (shown as 120 in FIG. 1). Although a grouping of only three chip carrier dies 310 is shown, the chip carrier array 300 may actually consist of a tape configuration having tens or hundreds of the chip carrier dies 310. This tape configuration will allow for continuous fabrication of chip carrier dies 310, and increase assembly production of MEMS devices.

In FIG. 3, the chip carrier array 300 may also include a chip carrier array frame 330, that retains each of the chip carrier dies 310 in an aligned manner. For example, the chip carrier array frame 330 may include a plurality of spacers 340 disposed between adjacent chip carrier dies 310. In addition, the chip carrier array frame 330 may include a plurality of alignment openings 350 that each receives a chip carrier die tab 360 of each of the chip carrier dies 310. Accordingly, each of the chip carrier dies 310 are disposed within the chip carrier array frame 330 is an aligned manner.

In FIG. 3, the chip carrier array frame 330 further includes a plurality of alignment marks (or holes) 370 that are disposed along a periphery portion of the chip carrier array frame 330. Accordingly, these alignment marks (or holes) 370 provide for alignment of the chip carrier array 300 during fabrication of the MEMS device 100 (in FIG. 1).

An exemplary method of fabricating a MEMS device will now be described in detail with regard to FIGS. 1, 2A-C, and 3.

Fabrication of the MEMS device 100 includes a plurality of individual processes that include wafer-scale assembly. Initially, whereas the enclosure carrier die 200 may be produced by the use of molding processing, the chip carrier dies 310 may be produced using a plurality of semiconductor processing. Specifically, the chip carrier dies 310 may be first formed by depositing a plurality of conductive and insulating layers onto a silicon substrate. Then, the silicon substrate may be further etched to form the acoustic ports 125 and partially singulated into individual chip carriers 320.

Specifically, a single continuous silicon substrate may have a plurality of conductive and insulating layers sequentially deposited onto a surface of silicon substrate to form conductive pathways parallel to the surface of the silicon substrate and through a thickness of the silicon substrate. Then, the silicon substrate may be partially etched to form individual silicon regions electrically separated from each other. The partial etching will produce orthogonal grooves that will subsequently be removed during singulation of the individual silicon regions, which will ultimately produce a plurality of the MEMS devices 100.

Next, each of the individual silicon regions may be processed to form the acoustic port 125 within each of the individual silicon regions. Of course, the acoustic ports 125 may be formed prior to forming of the individual silicon regions. Accordingly, after formation of the acoustic ports 125 and individual silicon regions, the LGA pads 122 and carrier pads 126 may be formed using another deposition process. Alternatively, the LGA pads 122 and carrier pads 126 may be formed before, during, or after formation of either the acoustic ports 125 or the partially etching of the silicon substrate.

In addition, a process for fabricating the chip carrier array 300 may include the processing of a single silicon substrate to form the plurality of chip carrier dies 310 and the chip carrier array frame 330. Accordingly, additional process steps may include etching of the single silicon substrate to form the chip carrier array frame 330. In addition, partial etching of the single silicon substrate may formation of the plurality of spacers 340 disposed between adjacent chip carrier dies 310, as well as the alignment openings 350 that receive the chip carrier die tabs 360 of each of the chip carrier dies 310. Accordingly, the chip carrier array 300 may include each of the chip carrier dies 310 aligned within the chip carrier array frame 330. Furthermore, the chip carrier array frame 330 may include enclosure alignment marks (or holes)

Next, a plurality of the MEMS dies 110 (in FIG. 1) must be produced and mounted onto corresponding ones of the chip carriers 320 of the chip carrier dies 310. This may be accomplished using an automated mounting system to ensure accurate alignment of the MEMS dies 110 (in FIG. 1) with regard to the acoustic ports 125 (in FIG. 1) of each of the chip carriers 320. Then, if using the conductive wires 116 (in FIG. 1), each of the MEMS dies 110 may be electrically interconnected to each of the chip carriers 320.

Next, each of the chip carriers 320 of at least one of the chip carrier dies 310 may receive the material for forming the adhesive bond 140 (in FIG. 1) along the periphery of each of the chip carriers 320. Then, the enclosure carrier die 200 is disposed above one of the chip carrier dies 310, with the cavity portion 250 and sidewalls 260 facing the previously applied adhesive material, and aligned with the chip carrier die 310. Alternatively, the enclosure carrier die 200 may include three of individual enclosure carrier dies 200 to correspond to the three chip carrier dies 310 of the chip carrier array 300. Accordingly, the total number of enclosure carrier dies 200 and chip carrier arrays 300 may be varied.

The alignment of the enclosure carrier die 200 and the chip carrier die 310 may be accomplished by making use of the alignment marks (or holes) 210 of the enclosure carrier die 200 and the alignment marks (or holes) 370 of the chip carrier array frame 330. The alignment may be accomplished by an automated optical system, such as image comparison or diffraction pattern alignment, or by human visual alignment. Accordingly, once the enclosure carrier die 200 and the chip carrier die 310 have been aligned, then the enclosure carrier die 200 and the chip carrier die 310 may be bonded together using the previously applied adhesive material.

Once the enclosure carrier die 200 and the chip carrier die 310 have been successfully bonded together, then the assembled enclosure carrier die 200 and the chip carrier die 310 may be transferred for singulation into individual MEMS devices 100. Alternatively, additional processing may be performed on the assembled enclosure carrier die 200 and the chip carrier die 310 including testing and evaluation prior to singulation into the individual MEMS devices 100.

During singulation, the assembled enclosure carrier die 200 and the chip carrier die 310 may be cut along the partially etched portions of the silicon substrate, as well as being separated from the chip carrier array frame 330.

Alternatively, if the chip carrier array 300 consists of a tape configuration having tens or hundreds of the chip carrier dies 310, as detailed above, then a plurality of the chip carrier dies 310 may be fabricated and disposed within a continuous chip carrier array 300 by making use of the plurality of spacers 340, as well as the alignment openings 350 that receive the chip carrier die tabs 360 of each of the chip carrier dies 310. In this case, once the enclosure carrier die 200 and the chip carrier die 310 are assembled, then each assembled enclosure carrier die 200 and the chip carrier die 310 may be separated from an adjacent assembled enclosure carrier die 200 and the chip carrier die 310. Next, the individual assembled enclosure carrier die 200 and the chip carrier die 310 may be singulated on a one-by-one basis.

According to the present invention, since individual components of the MEMS devices may be processed using known simply fabrication procedures and then assembled using simple bonding techniques, production efficiency of the MEMS devices may be greatly improved. In addition, since the individual components of the MEMS devices are separately fabricated, any defects in any of the individual components will not adversely affect the fabrication of the MEMS devices. Thus, production costs are lowered and It will be apparent to those skilled in the art that various modifications and variations can be made in the multivariable generator and method using a multivariable generator of the present invention without departing from the spirit or scope of the invention. Thus, it is intended that the present invention cover the modifications and variations of this invention provided they come within the scope of the appended claims and their equivalents.

What is claimed is:

1. A method of fabricating a MEMS device, comprising the steps of:
   providing an enclosure carrier die having a plurality of individual enclosures in a matrix configuration having a plurality of rows and columns, wherein each individual enclosure is formed using a thermoplastic and an electrically conductive material;

providing a chip carrier die having a plurality of individual chip carriers in the matrix configuration, each of the individual chip carriers including an acoustic port formed completely through a thickness of the individual chip carriers;

etching a chip carrier array frame which extends about a perimeter of the chip carrier die;

mounting a plurality of MEMS dies onto the plurality of individual chip carriers;

bonding the enclosure carrier die onto the chip carrier die to encapsulate each of the mounted MEMS dies with one of the plurality of individual enclosures; and separating the bonded enclosure carrier die and chip carrier die to produce a plurality of individual MEMS devices.

2. The method according to claim 1, wherein the step of fabricating an enclosure carrier die includes molding each of the plurality of individual enclosures spaced apart from each other by a first distance.

3. The method according to claim 1, wherein the step of fabricating a chip carrier die includes a plurality of etching processes performed on a silicon substrate to form the plurality of individual chip carriers.

4. The method according to claim 3, wherein the plurality of etching processes includes etching the silicon substrate partially through a thickness of the silicon substrate at regions where the step of cutting the bonded enclosure carrier die and chip carrier die occurs.

5. The method according to claim 3, wherein the plurality of etching processes includes etching the silicon substrate to form the acoustic ports.

6. The method according to claim 1, wherein the step of bonding the enclosure carrier die onto the chip carrier die includes a step of aligning the enclosure carrier die with the chip carrier die.

7. The method according to claim 1, wherein the step of separating the bonded enclosure carrier die and the chip carrier die includes using one of a blade and a laser beam.

8. The method according to claim 7, wherein a first distance between adjacent individual chip carriers and a second distance between adjacent individual enclosures is approximately equal.

9. The method according to claim 8, wherein a width of the blade and a width of the laser beam is approximately equal to the first and second distances.

10. The method according to claim 8, wherein the first distance is equal to twice a thickness of a sidewall of the individual enclosures and a distance between two of the individual enclosures.

11. The method according to claim 1, further comprising the step of forming a plurality of die pads on each of the individual chip carriers.

12. The method according to claim 11, further comprising the step of electrically connecting each of the MEMS dies mounted onto the chip carrier to the die pads on the chip carrier.

13. The method according to claim 12, wherein the MEMS dies are connected to the individual chip carriers via conductive wires.

14. The method according to claim 11, further comprising the step of forming a plurality of conductive pads on each of the plurality of MEMS dies.

15. The method according to claim 11, further comprising the step of forming a plurality of land grid array pads on each of the plurality of individual chip carriers.

16. The method according to claim 15, wherein the die pads are electrically connected to the land grid array pads.

17. The method according to claim 1, wherein the MEMS dies are in communication with the acoustic port.

18. The method according to claim 1, wherein the acoustic port has openings that are offset from each other.

19. The method according to claim 1, further comprising etching holes into the chip carrier array frame.

20. The method according to claim 19, wherein at least some of the holes receive tabs of the chip carrier die.

21. The method according to claim 19, further comprising using at least one of the holes for aligning the enclosure carrier die with the chip carrier die.

22. The method according to claim 21, wherein the alignment occurs via an automated optical system.

23. The method according to claim 22, wherein the automated optical system includes one of image comparison and diffraction pattern alignment.

24. The method according to claim 1, wherein the chip carrier array frame includes a plurality of spacers.

25. The method according to claim 1, wherein the step of separating the bonded enclosure carrier die and the chip carrier die includes separating the enclosure carrier die and the chip carrier die from the chip carrier array frame.

26. The method according to claim 1, wherein the electrically conductive material is a metal or carbon.

27. The method according to claim 1, wherein each of the plurality of individual enclosures encapsulates a single mounted MEMS die.

28. The method according to claim 1, wherein the enclosure carrier die includes an outer carrier frame.

29. The method according to claim 28, wherein the outer carrier frame includes alignment marks formed along a periphery portion of the outer carrier frame.

30. The method according to claim 29, wherein the alignment marks are holes.

31. A method of fabricating a MEMS device, comprising the steps of:

providing an enclosure carrier die having a plurality of molded single piece enclosures in a matrix configuration having a plurality of rows and columns;

providing a chip carrier die having a plurality of individual chip carriers in the matrix configuration, each of the individual chip carriers include an acoustic port formed completely through a thickness of the individual chip carriers;

etching a chip carrier array frame which extends about a perimeter of the chip carrier die;

mounting a plurality of MEMS dies onto the plurality of individual chip carriers;

bonding the enclosure carrier die onto the chip carrier die to encapsulate each of the mounted MEMS dies with one of the plurality of individual enclosures; and separating the bonded enclosure carrier die and chip carrier die to produce a plurality of individual MEMS devices.

* * * * *